United States Patent
Van Herpen et al.

(10) Patent No.: US 7,473,908 B2
(45) Date of Patent: Jan. 6, 2009

(54) GETTER AND CLEANING ARRANGEMENT FOR A LITHOGRAPHIC APPARATUS AND METHOD FOR CLEANING A SURFACE

(75) Inventors: Maarten Marinus Johannes Wilhelmus Van Herpen, Heesch (NL); Vadim Yevgenyevich Banine, Helmond (NL); Johannes Hubertus Josephina Moors, Helmond (NL); Wouter Anton Soer, Nijmegen (NL)

(73) Assignee: ASML Netherlands B.V., Veldhoven (NL)

( * ) Notice: Subject to any disclaimer, the term of this patent is extended or adjusted under 35 U.S.C. 154(b) by 248 days.

(21) Appl. No.: 11/486,386

(22) Filed: Jul. 14, 2006

(65) Prior Publication Data

US 2008/0011967 A1    Jan. 17, 2008

(51) Int. Cl.
*A61N 5/00* (2006.01)
*A61N 5/06* (2006.01)
*G21G 5/00* (2006.01)
*G01J 3/10* (2006.01)
*H05G 2/00* (2006.01)

(52) U.S. Cl. .............. 250/492.2; 250/492.1; 250/504 R

(58) Field of Classification Search .............. 250/492.1, 250/492.2, 492.22, 492.23, 504 R, 505.1, 250/515.1, 498.1; 427/162, 569; 428/472; 134/37, 32; 315/111.21; 118/620
See application file for complete search history.

(56) References Cited

U.S. PATENT DOCUMENTS

| | | |
|---|---|---|
| 2003/0053594 A1 | 3/2003 | Fornaciari et al. |
| 2005/0244572 A1* | 11/2005 | Bristol et al. ............... 427/162 |
| 2006/0072084 A1 | 4/2006 | Van Herpen et al. |

FOREIGN PATENT DOCUMENTS

| | | |
|---|---|---|
| WO | WO 2006/011105 A2 | 2/2006 |
| WO | WO 2006011105 A2 * | 2/2006 |
| WO | WO 2006/067730 A2 | 6/2006 |
| WO | WO 2006067730 A2 * | 6/2006 |

OTHER PUBLICATIONS

International Search Report issued for PCT Application No. PCT/NL2007/050318, dated Nov. 6, 2007.

* cited by examiner

*Primary Examiner*—Jack I Berman
*Assistant Examiner*—Brooke Purinton
(74) *Attorney, Agent, or Firm*—Pillsbury Winthrop Shaw Pittman, LLP

(57) ABSTRACT

A lithographic apparatus includes a radiation source and an object with a first surface which is configured to retain metal contaminants. This surface has the function of a getter. The first surface is arranged substantially outside the region traversed by the radiation beam generated by the radiation source during lithographic processing. The first surface may further be used to retain volatile contaminants generated in a cleaning method.

32 Claims, 6 Drawing Sheets

GETTER AND CLEANING ARRANGEMENT FOR A LITHOGRAPHIC APPARATUS AND METHOD FOR CLEANING A SURFACE

BACKGROUND OF THE INVENTION

1. Field of the Invention

The present invention relates to a lithographic apparatus with a getter for retaining metal contaminants. The present invention also relates to a method for cleaning optical elements from metal deposition.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus comprise steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In a lithographic apparatus, the size of features that can be imaged onto the substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation, e.g. of around 13 nm. Such radiation is termed extreme ultraviolet (EUV) or soft x-ray, and possible sources comprise, for example, laser-produced plasma sources, discharge plasma sources, or synchrotron radiation from electron storage rings.

The source of EUV radiation is typically a plasma source, for example a laser-produced plasma or a discharge source. A common feature of any plasma source is the production of fast ions and atoms, which are expelled from the plasma in all directions. These particles can be damaging to the collector and condenser mirrors which are generally multilayer mirrors or grazing incidence mirrors, with fragile surfaces. This surface is gradually degraded due to the impact, or sputtering, of the particles expelled from the plasma and the lifetime of the mirrors is thus decreased. The sputtering effect is particularly problematic for the radiation collector (in view of its relative close proximity to the EUV source). The purpose of this mirror is to collect radiation which is emitted in all directions by the plasma source and direct it towards other mirrors in the illumination system. The radiation collector is positioned very close to, and in line-of-sight with, the plasma source and therefore receives a large flux of fast particles from the plasma. Other mirrors in the system are generally damaged to a lesser degree by sputtering of particles expelled from the plasma since they may be shielded to some extent.

In the near future, extreme ultraviolet (EUV) sources will probably use tin (Sn) or another metal vapor to produce EUV radiation. This tin may leak into the lithographic apparatus, and will be deposited on mirrors in the lithographic apparatus, e.g. the mirrors of the radiation collector (also called collector). The mirrors of such a radiation collector may have a EUV reflecting top layer of, for example, ruthenium (Ru). Deposition of more than approximately 10 mm tin on the reflecting Ru layer will reflect EUV radiation in the same way as bulk Sn. It is envisaged that a layer of a few nm Sn is deposited very quickly near a Sn-based EUV source. The overall transmission of the collector may decrease significantly, since the reflection coefficient of tin is much lower than the reflection coefficient of ruthenium. In order to prevent debris from the source or secondary particles generated by this debris from depositing on the radiation collector, contaminant barriers may be used. Though such contaminant barriers may remove part of the debris, still some debris will deposit on the radiation collector or other optical elements, such as grazing incidence mirrors, normal incidence mirrors, etc. Further, also carbon (C) may deposit on optical elements like mirrors, which may also lead to a decrease in optical properties like reflection, etc.

SUMMARY OF THE INVENTION

It is desirable to provide a lithographic apparatus wherein the presence of contaminants is reduced or wherein such contaminants are removed or made harmless.

According to a first embodiment of the invention, there is provided a lithographic apparatus comprising a radiation source, the lithographic apparatus further comprising an object with a first surface which is configured to retain metal contaminants, wherein the first surface is arranged substantially outside the region traversed by the radiation beam generated by the radiation source during lithographic processing. There is also provided such lithographic apparatus comprising a metal-vapor based EUV radiation source.

According to a further embodiment of the invention, there is provided a method for binding metal contaminants in a lithographic apparatus comprising a radiation source, the method comprising the use of an object in the lithographic apparatus, the object having a first surface, which is configured to retain metal contaminants, and which first surface is arranged substantially outside the region traversed by the radiation beam generated by the radiation source during lithographic processing. There is also provided such method wherein the lithographic apparatus comprises a metal-vapor based EUV radiation source.

According to yet another embodiment of the invention, there is provided a method for cleaning an optical element in a lithographic apparatus comprising a radiation source, the method comprising the use of an object in the lithographic apparatus, the object having a first surface, which is configured to retain metal contaminants, and which first surface is arranged substantially outside the region traversed by the radiation beam generated by the radiation source during lithographic processing, the optical element having a second surface, wherein the second surface is to be cleaned from metal deposition, the method further comprising providing one or more gasses selected from the group of a hydrogen containing gas, a hydrogen radical containing gas and a halogen containing gas to the second surface of the optical element. There is also provided such method wherein the lithographic apparatus comprises a metal-vapor based EUV radiation source.

In another embodiment, the first surface is not arranged in the path of the radiation beam generated by the radiation source during lithographic processing.

In another embodiment, the first surface may be configured to retain metal contaminants from the metal-vapor based EUV radiation source.

In another embodiment, the first surface comprises a metal surface wherein the metal is selected from one or more metals from the group of Ru, Rh, Pd, Ag, Re, Os, Ir, Pt and Au.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
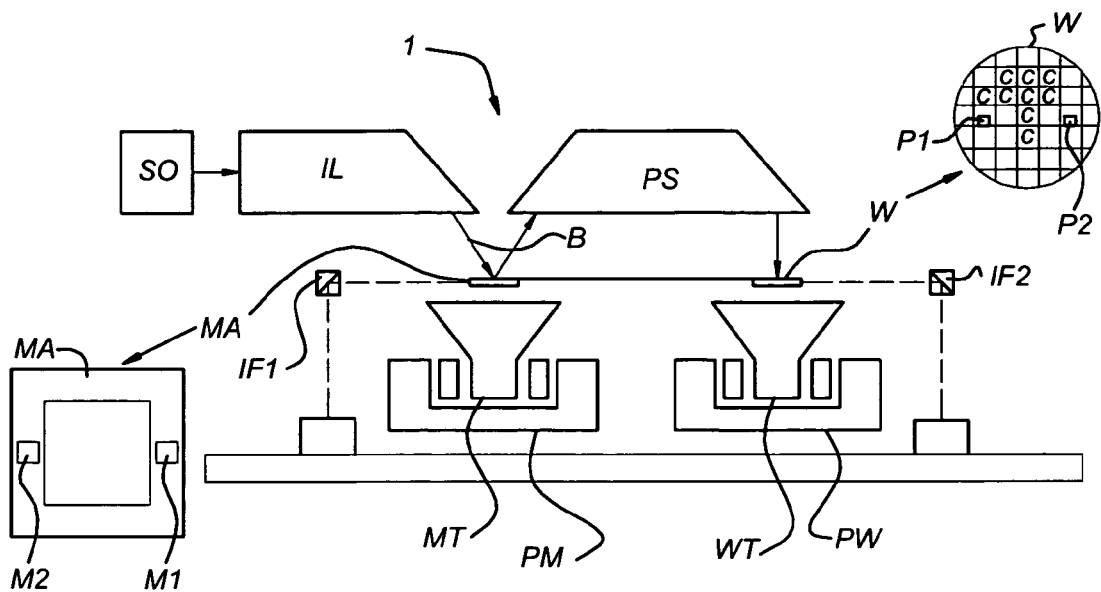
FIG. 1 depicts a lithographic apparatus according to an embodiment of the invention.

FIG. 1 schematically depicts a lithographic apparatus 1 according to one embodiment of the invention. The apparatus 1 comprises an illumination system (illuminator) IL configured to condition a radiation beam B (e.g. UV radiation or EUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. comprising one or more dies) of the substrate W.

The illumination system may comprise various types of optical components, such as refractive, reflective, magnetic, electromagnetic, electrostatic or other types of optical components, or any combination thereof, to direct, shape, or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern comprises phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices comprise masks, programmable mirror arrays, and programmable LCD panels. Masks are well known in lithography, and comprise mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, comprising refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 (e.g. an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper, as opposed to a scanner, the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In an embodiment according to the invention, there is provided a lithographic apparatus comprising an illumination system configured to condition a radiation beam; a support configured to support a patterning device, the patterning device being configured to impart the radiation beam with a pattern in its cross-section to form a patterned radiation beam; a substrate table configured to hold a substrate; a projection system configured to project the patterned radiation beam onto a target portion of the substrate, and an object with a first surface according to the invention. In a further embodiment, the lithographic apparatus comprises an EUV source, which is configured to generate a beam of EUV radiation for EUV lithography. In general, the EUV source is arranged in a radiation system (see below). The illumination system is configured to condition the EUV radiation beam of the EUV source.

The term "lens", where the context allows, may refer to any one or combination of various types of optical components, comprising refractive, reflective, magnetic, electromagnetic and electrostatic optical components.

The terms "radiation" and "beam" used herein encompass all types of electromagnetic radiation, comprising ultraviolet (UV) radiation (e.g. having a wavelength λ of 365, 248, 193, 157 or 126 nm) and extreme ultra-violet (EUV or soft X-ray) radiation (e.g. having a wavelength in the range of 5-20 nm, e.g. 13.5 nm), as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths which can be produced by a mercury discharge lamp: G-line 436 nm; H-line 405 nm; and/or I-line 365 nm. VUV is Vacuum UV (i.e. UV absorbed by air) and refers to wavelengths of approximately 100-200 nm. DUV is Deep UV, and is usually used in lithography for the wavelengths produced by excimer lasers like 126 nm-248 nm. It should be appreciated that radiation having a wavelength in the range of, for example, 5-20 nm relates to radiation with a certain wavelength band, of which at least part is in the range of 5-20 nm.

The term "halogen containing gas" or "hydrogen containing gas" refers to gases or gas mixtures comprising at least a halogen gas or hydrogen gas, respectively. The term "halogen" in the term "halogen containing gas" refers to at least one or more selected of F, Cl, Br and I, either as an atom (radical) or as compound, for example $F_2$, $Cl_2$, $Br_2$, $I_2$, HF, HCl, HBr, HI, interhalogen compounds, for example $ClF_3$, or other compounds comprising one or more selected from F, Cl, Br and I which can be brought into the gas phase at a temperature between about 50-500°. In an embodiment one or more of $F_2$, $Cl_2$, $Br_2$, $I_2$ may be used, in particular $I_2$.

The terms "hydrogen" and "hydrogen radicals" comprise their isotopes as well, in particular, deuterium. Hence, the term "hydrogen containing gas" refers to a gas comprising $H_2$ or deuterium or tritium analogues thereof. In an embodiment, the hydrogen containing gas comprises one or more selected from the group of $H_2$, HD, $D_2$, HT, DT, $T_2$. Hence, the term "hydrogen containing gas" refers to a gas selected from the group of a $H_2$, $D_2$, $T_2$, HD, HT and DT containing gas. A halogen containing gas or a hydrogen containing gas may further comprise additional components like buffer gasses, such as Ar, etc. A "flow of hydrogen radicals" refers to a gas flow, wherein in the gas also hydrogen radicals are present. Usually, such a gas will also contain hydrogen molecules (like one or more of $H_2$, HD, $D_2$, HT, DT, $T_2$), since not all hydrogen may be converted into radicals, and due to radical recombination. The term "hydrogen radical containing gas" refers to a gas comprising hydrogen radicals or deuterium or tritium analogues thereof. Such gas may further comprise other components like $H_2$, etc., which has not been dissociated or has recombined from hydrogen radicals. The term "hydrogen containing gas source" refers to one or more sources of gas, wherein the gas at least contains molecular hydrogen (and/or analogues thereof, see above). The term "hydrogen radical source" refers to a device that converts at least part of the hydrogen gas (of the hydrogen containing gas) into hydrogen radicals, such that a hydrogen radical containing gas is provided. The phrase "converting at least part of the hydrogen containing gas into a hydrogen radical containing gas" refers herein to the process wherein at least part of the total amount of hydrogen molecules of the hydrogen containing gas (from the hydrogen containing gas source) is converted into hydrogen radicals, thereby forming a hydrogen radical containing gas.

The terms "cleaning arrangement" and "method for cleaning" refer to an arrangement and a method that may be used in a cleaning process. As mentioned below, providing hydrogen radicals may be used for reduction of oxides, like Sn oxides (or other oxides) and in a next process, halogens (like for example $I_2$) may remove the metal, like Sn (or Mn, Zn) by the formation of halides. Hence, "cleaning" in this context may imply a complete or partial removal of undesired deposition but may also imply a part of a cleaning process, like a reduction (without substantially removing deposition). Therefore, the term "cleaning" also comprises treating (treatment) with a gas in the course of a cleaning of a cleaning process. Further, in an embodiment hydrogen radicals may nevertheless be used to remove deposition (by formation of e.g. Sn-hydrides (or Mn or Zn hydrides). The cleaning process may also be used to remove at least partially C (carbon) deposition (by the formation of volatile hydrocarbons such as $CH_4$). The phrase "to be cleaned" also refers to "to be partially cleaned".

The terms "optical element", "surface to be cleaned", also related to a plurality of "optical elements" and "surfaces to be cleaned", respectively.

Figure 2:
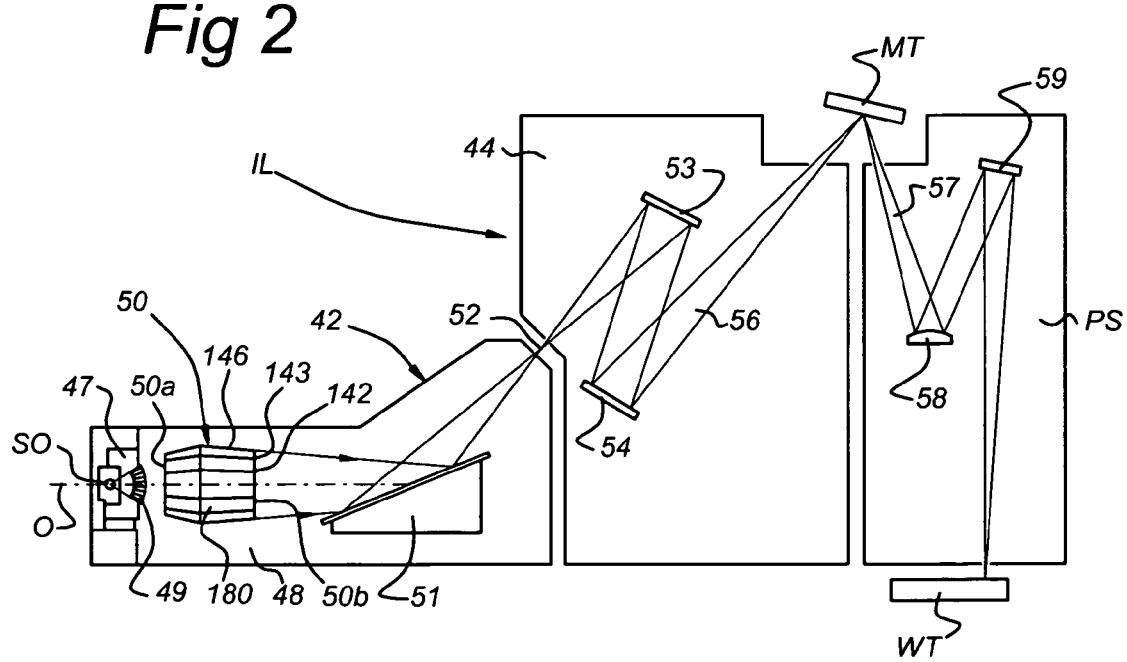
FIG. 2 depicts a side view of an EUV illumination system and projection optics of a lithographic apparatus according to FIG. 1.

FIG. 2 shows the projection apparatus 1 in more detail, comprising a radiation system 42, an illumination optics unit 44, and the projection system PS. The radiation system 42 comprises the radiation source SO which may be formed by a discharge plasma. EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, an electrical discharge. Partial pressures of, for example, 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier or contaminant trap 49 which is positioned in or behind an opening in source chamber 47. The contaminant trap 49 may comprise a channel structure. Contamination trap 49 may also comprise a gas barrier or a combination of a gas barrier and a channel structure. In an embodiment, an Sn source as EUV source is applied.

The collector chamber 48 comprises a radiation collector 50 (also called collector mirror or collector) which may in an embodiment be formed by a grazing incidence collector. The radiation collector 50 may be placed in the vicinity of the source SO or an image of the source SO. Radiation passed by collector 50 can be reflected off a grating spectral filter 51 to be focused in a virtual source point 52 at an aperture in the collector chamber 48. From collector chamber 48, a beam of radiation 56 is reflected in illumination optics unit 44 via normal incidence reflectors 53, 54 onto a reticle or mask positioned on reticle or mask table MT. A patterned beam 57 is formed which is imaged in projection system PS via reflective elements 58, 59 onto wafer stage or substrate table WT. More elements than shown may generally be present in illumination optics unit 44 and projection system PS. Grating spectral filter 51 may optionally be present, depending upon the type of lithographic apparatus. Further, there may be more mirrors present than those shown in the figures, for example there may be 1-4 more reflective elements present than 58, 59. Radiation collectors 50 are known from the prior art.

In an embodiment, radiation collector 50 may be a grazing incidence collector. Radiation collector 50 has an upstream radiation collector side 50a and a downstream radiation collector side 50b. The collector 50 is aligned along an optical axis O. The source SO or an image thereof is located on optical axis O. The radiation collector 50 may comprise reflectors 142, 143, 146 (also known as a Wolter-type reflector comprising several Wolter-type reflectors). Sometimes they are also called a shell. These reflectors 142, 143, 146 may be nested and rotationally symmetric about optical axis O. In FIG. 2, an inner reflector is indicated by reference number 142, an intermediate reflector is indicated by reference number 143, and an outer reflector is indicated by reference number 146. The radiation collector 50 encloses a certain volume, i.e. the volume within the outer reflector(s) 146. Usually, this volume within outer reflector(s) 146 is circumferentially closed, although small openings may be present. All the reflectors 142, 143 and 146 comprise surfaces of which at least part comprises a reflective layer or a number of reflective layers. Hence, reflectors 142, 143 and 146 (more reflectors may be present and embodiments of radiation collectors (also called collector mirrors) 50 having more than 3 reflectors or shells are comprised herein), are at least partly designed for reflecting and collecting EUV radiation from source SO, and at least part of the reflector may not be designed to reflect and collect EUV radiation. For example, at least part of the back side of the reflectors may not be designed to reflect and collect EUV radiation. The latter part may also be called back side. On the surface of these reflective layers, there may in addition be a cap layer for protection or as optical filter provided on at least part of the surface of the reflective layers. Reference number 180 indicates a space between two reflectors, e.g. between reflectors 142 and 143. Each reflector 142, 143, 146 may comprise at least two adjacent reflecting surfaces, the reflecting surfaces further from the source SO being placed at smaller angles to the optical axis O than the reflecting surface that is closer to the source SO. In this way, a grazing incidence collector 50 is configured to generate a beam of (E)UV radiation propagating along the optical axis O. At least two reflectors may be placed substantially coaxially and extend substantially rotationally symmetric about the optical axis O. It should be appreciated that radiation collector 50 may have further features on the external surface of outer reflector 146 or further features around outer reflector 146, for example a protective holder, a heater, etc.

Figure 3:
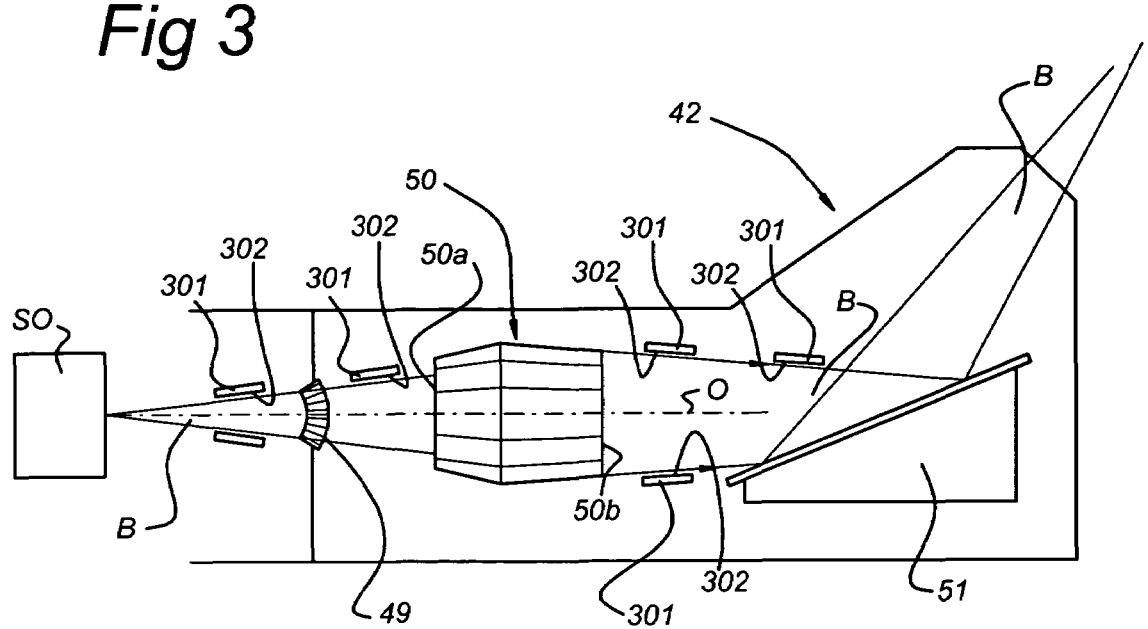
FIG. 3 depicts an embodiment of a lithographic apparatus with an object with a surface to retain metal.

Instead of a grazing incidence mirror as collector mirror 50, also a normal incidence collector may be applied. Collector mirror 50, as described herein in an embodiment in more detail as nested collector with reflectors 142, 143, and 146, and as schematically depicted in FIGS. 2 and 3 is herein further used as example of a collector. Hence, where applicable, collector mirror 50 as grazing incidence collector may also be interpreted as collector in general and in another embodiment also as normal incidence collector.

Further, instead of a grating 51, as schematically depicted in FIG. 2, also a transmissive optical filter may be applied. Optical filters transmissive for EUV and less transmissive for or even substantially absorbing UV radiation are known in the art. Hence, "grating spectral purity filter" is herein further indicated as "spectral purity filter" which includes gratings or transmissive filters. Not depicted in FIG. 2, but also included as optional optical element may be EUV transmissive optical filters, for instance arranged upstream of collector mirror 50, or optical EUV transmissive filters in illumination unit 44 and/or projection system PS.

Below, the invention is especially described with respect to Sn as example of a metal contamination. Hence, the metal contamination is further often indicated as "Sn deposition" or "Sn contamination". However, other metal-vapor sources may be applied to generate for instance EUV radiation for EUV lithography, which may produce other metal contaminants, and thereby deposition. In addition to metal sources as source SO that produces metal contaminants, metal contaminants may also originate from other sources (non-optical sources), such as solder, filaments, supports, etc. Hence, the terms "Sn deposition" or "Sn contamination" especially refer to Sn depositions and contaminants, but may also encompass other metal depositions and contaminants. The term "Sn contamination" (and deposition likewise) also refers to metallic Sn deposition. However, due to the presence of (traces of) oxygen, Sn contamination may also be oxidized to Sn oxides. Sn oxides or hydroxides are also encompassed in the terms "Sn contamination" and "Sn deposition". Sn oxyhalides are also encompassed. Likewise, this applies to other metals such as Mn and Zn. Hence, in another embodiment, the metal contaminants are selected from the group of metals, metal oxides, metal hydroxides, metal hydrides, metal halides and metal oxy halides of one or more elements selected from the group of Sn, Mn and Zn. Sn may enter the lithographic apparatus 1 due to source SO (when based on Sn) or from other sources such as solder. Here the formation of hydrides ($SnH_4$ in this example) leads to the unwanted transport of metal towards the mirrors. Likewise, Mn (manganese) and Zn (zinc) may enter the lithographic apparatus 1 due to local heating of parts in the lithographic tool. A third mechanism is the reduction of oxides of metals during the cleaning operation. The atomic hydrogen generated during cleaning reduces the metal oxide and the resulting metal act like a source of metal due to a elevated metal vapor pressure compared to the vapor pressure of the oxidized metal.

Further, contaminants may be Li contaminants from for instance a Li source. Halides and hydrides of Sn, Mn and Zn metals appear to deposit on the getter.

The term "deposition" refers to contaminants retained (bound) to a surface. Metal contaminants may be present within the lithographic apparatus as gases or as particles. When in contact with a surface and being bound to such surface (for instance via ionic, metallic or Van der Waals binding), the metal contamination may form a deposition. Such deposition may comprise one or more layers, islands or (other) local accumulations of contaminants. The deposition may have another character than the gas or particle before deposition. For instance, Sn hydride may form a metallic Sn deposition (including redeposition) or a Sn-oxide deposition (including redeposition).

All optical elements shown in FIG. 2 (and optical elements not shown in the schematic drawing of this embodiment) are vulnerable to deposition of contaminants. Especially when using a metal vapor source, metals, metal particles or metal compounds produced by source SO, for example, Sn of a Sn source may deposit on the optical elements. This is the case for the radiation collector 50 and, if present, the spectral purity filter 51, but also to normal incidence reflectors 53, 54 and reflective elements 58, 59 or other optical elements, for example additional mirrors, gratings, (transparent) optical filters, etc. Different optical elements may have to be at least partially cleaned from e.g. Sn (or other metals) and/or C deposition or be protected against deposition of contaminants by using a getter. In an embodiment, an optical element is selected from the group of collector mirror 50, radiation system 42 (also known as source collector module), illumination system IL and projection system PS (also known as projection optics box POB). In an embodiment, the element may also be a spectral purity filter 51. In yet another embodiment, the element may also be a mask, in particular a reflective multilayer mask. Hence, in an embodiment the optical element selected from the group of optical elements contained in radiation system 42, like collector mirror 50 (be it a normal incidence collector or grazing incidence collector), spectral purity filter 51 (grating or transmissive filter), radiation system (optical) sensors (not depicted), optical elements contained in illumination system 44, like mirrors 53 and 54 (or other mirrors, if presents) and illumination system (optical) sensors (not depicted), optical elements contained in the projection system PS, like mirrors 58 and 59 (or other mirrors, if presents) and projection system (optical) sensors (not depicted). In another embodiment, the term "optical element" also comprises contaminant barrier 49. Therefore, the term "optical element" refers to one or more elements selected from the group of a grating spectral filter, a transmissive optical filter, multi-layer mirrors, coating filters on multilayer mirrors, grazing incidence mirrors, normal incidence mirrors (such as a multi-layer collector), grazing incidence collectors, normal incidence collectors, (optical) sensors (such as EUV sensitive sensors), contaminant barrier 49, and masks.

Further, not only optical elements may be contaminated by Sn, etc., but also walls, holders, supporting systems, gas locks, contaminant barrier 49, etc. This deposition may not directly influence the optical properties of the optical elements, but due to redeposition, this deposition may deposit (i.e. redeposit) on optical elements, thereby influencing the optical properties. Hence, even deposition not deposited on optical elements may in a later stage due to redeposition lead to contamination of surfaces of optical elements. This may lead to a decrease in optical performance like reflection, transmission, uniformity, etc.

Hence, in another embodiment, getters are arranged within lithographic apparatus 1. A non-limiting embodiment and variants thereon are schematically depicted in FIG. 3. FIG. 3 schematically depicts part of radiation system 42. Within this module, objects 301 are arranged. They may be arranged anywhere, but are especially arranged not in the path of radiation beam B generated by radiation source SO during lithographic processing. Object(s) 301 may be movable (see also below).

The objects 301 comprise a surface 302, indicated as first surface, configured to retain metal from for instance s metal-vapor based source SO and/or other sources of metal within lithographic apparatus 1 (i.e. objects 301 are getters, especially chemical getters). Such surface may be substantially flat, may be curved, may be rough on micro-scale in order to increase effective surface, etc. Object 301 may for instance be a plate. In an embodiment, a plate is used having an external area of surface 302 of about 1-1000 cm$^2$, especially 5-500 cm$^2$.

In another embodiment surface 301 comprises meshes, sponges or other roughnesses, that increase the surface area of surface 301, thereby improving its capability to retain metal molecules. In yet another embodiment, surface 301 comprises nano structures such as nano pores (obtainable by for instance an etching process) or nano particles (obtainable by for instance a deposition or sputtering process).

In another embodiment, first surface 302 is not a surface layer of an optical element. As mentioned above, first surface 302 is in an embodiment arranged substantially outside the region traversed by the radiation beam B generated by radiation source SO during lithographic processing. Especially, the shortest distance between surface 302 and beam B is between about 0.1 mm and 100 cm. In another embodiment, the shortest distance of between surface 302 and beam B is between about 0.5 and 10 cm.

In another embodiment, first surface 302 comprises a metal surface wherein the metal is selected from one or more metals from the group of Ru, Rh, Pd, Ag, Re, Os, Ir, Pt and Au. It appears that these surfaces, i.e. surfaces of these metals, are able to scavenge (retain) Sn. Hence, by providing objects 301, Sn may be retained by surface 302. Surface 302 acts as a getter. In another embodiment, the surface comprises Pt. In another specific embodiment, the surface comprises Ru. In another embodiment, surface 302 comprises a metallic surface. In yet another embodiment, surface 302 comprises a metal oxide. Hence, in an embodiment, the term "metal surface" also includes metal oxide surface.

In the embodiments herein described, first surface 302, and in another embodiment the entire object 301, is positioned substantially (or completely) outside the radiation path which contributes to the formation of the image (during lithographic processing). If the getter surface 302 happens to receive some radiation, e.g. at the edge of a reflecting surface, it may not be a significant problem provided that the formation of the image is not substantially influenced. To give another example, an aperture could be constructed with a getting surface on the area which blocks radiation from proceeding through the rest of the system. In such embodiment, surface 302 is at least partially in the radiation beam but not in the part of the radiation beam which reaches the next optical component. Hence, the part of the radiation path that contributed to the formation of the image is not disturbed by surface 302. Therefore, the phrase "arranged substantially outside the region traversed by the radiation beam B generated by radiation source SO during lithographic processing" refers to arrangements of surface 302 wherein surface 302 (and especially the entire object 301) is arranged in the apparatus without disturbing the formation of the image on wafer W. In another embodiment, however, first surface 302 is also not arranged in the path of the radiation beam generated by the radiation source during lithographic processing, i.e. it substantially does not receive radiation from source SO, not even from the sides of radiation beam B.

It further appears that the presence of hydrogen or hydrogen radicals (see below) or both promotes the deposition of Sn (or other metals) on surface 302, and thus also promotes its getter function. Hence, in another embodiment, a hydrogen containing gas or hydrogen radical containing gas is applied in the module where object 301 (i.e. surface 302) is arranged. The gas in lithographic apparatus 1 or in the module where object 301 is arranged, may be maintained at room temperature and also surface 302 of object may be maintained at room temperature. Elevated temperatures, for instance heating of surface 302 to about 250° C. may also be performed. However, even at room temperature it appears that surface 302 has a getter function and collects Sn, etc. When other surfaces than the above mentioned metals are used, the getter function is in general weaker or even absent. For instance, when using a Si surface, the deposition of Sn is more than an order of magnitude lower.

In another embodiment, the module containing object 301 is maintained at a pressure between about $10^{-7}$ and 500 mbar, especially between about $10^{-2}$ and 1 mbar.

In another embodiment, the partial pressure of hydrogen (i.e. including the above mentioned analogues) in the module is between about 0.01 and 500 mbar, more desirably between about 10 and 300 mbar. The total gas pressure is in an embodiment equal to or below about 500 mbar, more desirably equal to or below about 300, even more desirably equal to or below about 200 mbar (i.e. including hydrogen gas).

In another embodiment, the optical element comprises collector mirror 50, and the partial pressure of hydrogen in module 42 is between about 0.01 and 500 mbar, more desirably between about 10 and 300 mbar. The total gas pressure is in an embodiment equal to or below about 500 mbar, more desirably equal to or below about 300, even more desirably equal to or below about 200 mbar (i.e. including hydrogen gas). These conditions are especially useful when collector mirror 50 includes a collector mirror as described above as "Wolter collector", and as schematically depicted in FIGS. 2 and 3.

In yet another embodiment, the optical element 201 comprises an optical element contained in illumination unit IL or projection system PS. The partial pressure of hydrogen in module IL or PS may be between about 0.01 and 100 mbar, more desirably between about 0.01 and 1 mbar. The total gas pressure is in an embodiment equal to or below about 100 mbar, more desirably equal to or below about 1 (i.e. including hydrogen gas). Likewise, the part of lithographic apparatus 1 containing the mask may be maintained at such pressures.

Figure 4A:
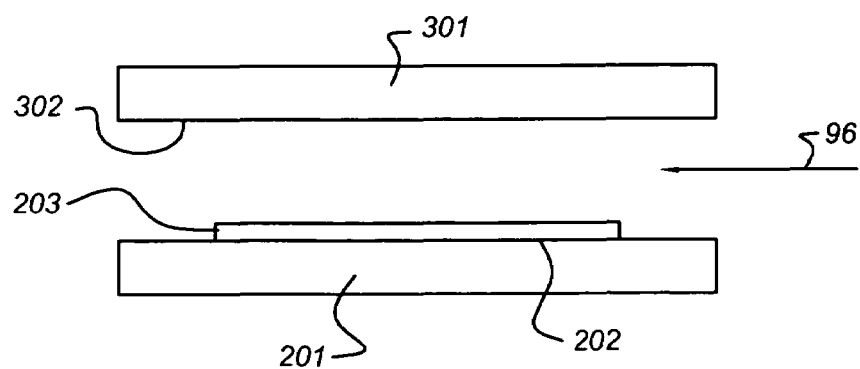
FIGS. 4a-4d depict embodiments of the invention.

Referring to FIG. 4a, hydrogen radicals are present due to a flow or due to diffusion. The presence of hydrogen may for instance be due to the presence of gas locks which may use hydrogen and may also deliberately be added. Hydrogen radicals may be generated with the aid of a number of means (see below). The hydrogen radical containing gas is indicated with reference number 96. Optical element 201 may have undesired deposition 203 on surface 202. Optical element 201 represents any surface that may be subject to deposition (or redeposition), for example those of optical elements such as lenses, mirrors, sensors, etc. (see also above). Optical element 201 may refer to collector mirror 50 and spectral purity filter 51. An object 301 may be arranged adjacent to surface 202. Due to the presence of hydrogen radicals 96, deposition forms volatile hydrides, such as tin hydrides, zinc hydrides, etc. This volatile hydrides diffuse away or are moved away by the presence of a flow of the hydrogen radical containing gas 96. It appears that the hydrides preferentially deposit (i.e. redeposit) on surface 302. Hence, in this way cleaning from surface 202 may be improved and/or gettering (i.e. retaining undesired contaminants) by surface 302 of object 301 is improved. Hence, in this way, also (re)deposition on surface 202 may be decreased: contaminants from elsewhere (re)

deposit on surface 302. For instance, Sn from source SO (if Sn based) may deposit on surface 302, either as Sn particles, or as Sn hydrides (which are formed due to the presence of Sn and hydrogen radicals 96). When the hydrides come into contact with surface 302, Sn or Sn compounds deposit (bind), and hydrogen radicals may be formed which may again be used for reaction with contaminants or deposition on (optical) elements in the module. Surface 302 acts as a kind of chemical getter. In an embodiment, it may also act as (part of) a cleaning arrangement.

Figure 4B:
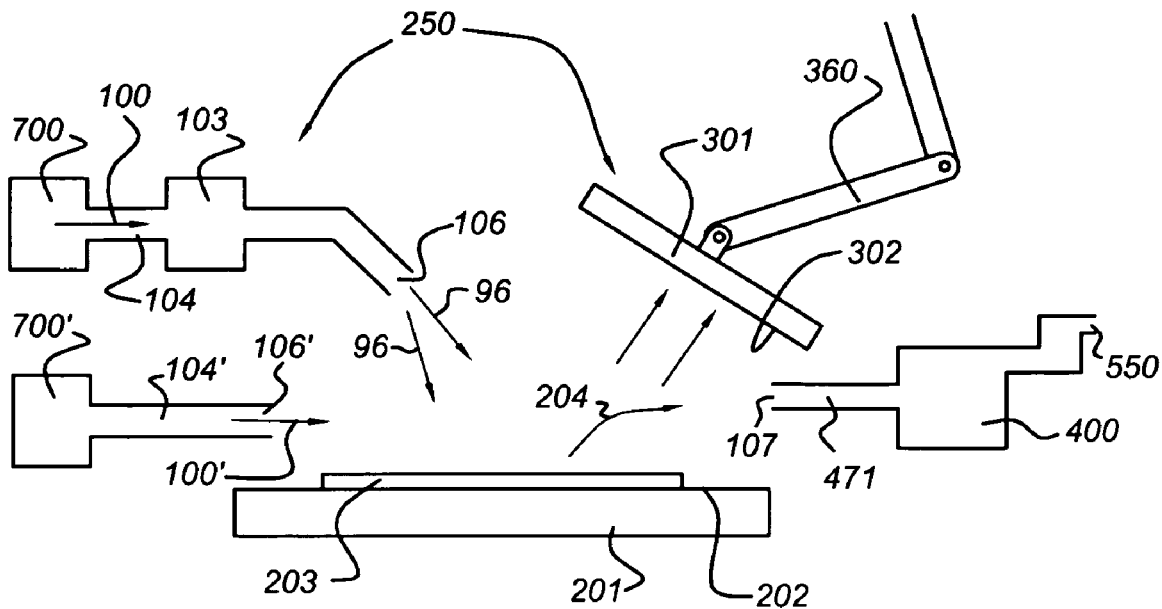

In FIG. 4b, another embodiment is shown, again with (optical) element 201, but now with object 301 which is movable (optional feature). The object 301 may be moved, for example by any conventional mechanism. In FIG. 4b, an embodiment is shown wherein object 301 is moveable by means of a movable arm 360. By using a moveable object 301, object 301 may be arranged outside the path of the radiation beam B during lithographic processing, but may be arranged adjacent to (optical) element 201 during a cleaning process (see also below). The term "adjacent" herein may in an embodiment indicate that a shortest distance between second surface 302 and first surface 202 is between about 0.1 mm and 20 cm, more desirably between about 0.5 and 10 cm.

The arrangement in FIG. 4b further comprises a hydrogen source 700. Hydrogen source 700 may be an "additional" source, but may also be a "natural" source such as a gas lock, for instance a gas lock between radiation module 42 and illumination module IL. In an embodiment, source 700 is a source of hydrogen containing gas 100, that is led to hydrogen radical source 103. Gas 100 may be fed through tube 104, arranged to feed hydrogen radical source 103 with hydrogen containing gas 100 from hydrogen containing gas source 700. Hydrogen radicals may be produced by hydrogen radical source 103 from $H_2$ from the $H_2$ containing gas 100 by one or more radical formation means selected from the group of a hot filament, a plasma (e.g. RF generated), radiation (especially UV radiation), and a catalyst for converting $H_2$ into hydrogen radicals. Hence, hydrogen radical source 103 comprises one or more selected from the group of a filament that can be heated (including a device arranged to control the temperature of the filament), a plasma generator, a source of radiation (i.e. not source SO and a catalyst. Embodiments of hydrogen radical source 103 are described in U.S. Patent Application Publication 2006/0072084 A1, which is incorporated herein by reference. In another embodiment, hydrogen radical source 103 comprises a catalytic surface which is catalytically active for the dissociation of hydrogen. This catalytically active surface may in another embodiment be the internal surface of at least part of tube 104.

In yet another embodiment, hydrogen radical source 103 comprises source SO, for instance UV radiation of source SO may be used to generate hydrogen radicals.

Tube 104 is in gaseous contact with source 700 and may be arranged to provide gas 100 at a predetermined position, for instance within a few centimeters of surface 202. In another embodiment, outlet 106 is less then about 10 cm from at least part of surface 202.

In an embodiment, tube 104 may be moveable, for instance to be positioned at predetermined positions between two shells of collector mirror 50 (as indicated with reference number 180 in FIG. 2).

The hydrogen containing gas 100 at least partially flows in the direction of the surface 202, for instance due to a pump arranged to induce a gas flow in tube 104 or due to an overpressure in source 700 relative to the pressure of the volume wherein optical element 201 is arranged, or due to an exhaust pump 400. Combinations of two or more may be used, such as a pump arranged to provide a flow 100 through tube 104 and pump 400, arranged to exhaust gas from the volume wherein the optical element 201 is arranged. In the configuration schematically depicted in FIG. 4b, a flow may be provided to the surface 202. This flow initially comprises flow 100, which is the hydrogen containing gas. Further, in addition to the above, the term "flow" may also include diffusion of hydrogen gas 100 and where applicable also diffusion of hydrogen radicals 96. Hence, when using a flow of hydrogen containing gas 100, this flow may be but is not necessarily directed in the direction of surface 202. Volatile reaction products may, due to diffusion, also diffuse away from surface 202.

Hydrogen radical source 103 generates from hydrogen containing gas 100 hydrogen radical containing gas 96. This hydrogen radical containing gas 96 may for instance be led/flowed to surface 202 of element 201. Due to the presence of the hydrogen radicals, metal contaminants and metal deposition 203 on surface 202 may be transferred into volatile hydrides ((re)deposition removal). This is indicated with reference number 204. The volatile hydrides may be exhausted via exhaust 550, for instance by using pump 400. Further, the volatile contaminants may be gettered by first surface 301 of object 302, thereby forming less or non-mobile depositions on surface 302.

At least part of the contaminants 203 will be removed, for instance as volatile hydrides (like $CH_4$, $SnH_4$ etc. or halides, like Sn-halides such as Sn chlorides or Sn iodides, etc.), but also $H_2O$ may be formed (in case Sn oxides are reduced to Sn) (see above) and be removed. The volatile contaminates may be removed via an exhaust. In an embodiment, the volatile contaminants are at least partly exhausted by pump 400. Pump 400 comprises an opening or inlet (exhaust opening) or plurality of openings 107 and an exhaust 550. Optionally, opening 107 may be provided into tube 471, which is in gaseous contact with pump 400. In an embodiment, tube 471 may be movable to predetermined positions close to the surface to be cleaned, such that tube 471 may be positioned to exhaust the volatilized contaminants 204 due to the treatment with hydrogen radicals, and optionally halogens.

The flow of the hydrogen radical containing gas 96 is in an embodiment at least 1 m/s.

Alternatively, or additionally, another source of gas may be present. This is indicated in FIG. 4b with reference number 700', which indicates a source of a halogen containing gas 100'. Halogens may form with metals, such as Sn, volatile halides. In this way, also metal may be mobilized and may deposit on surface 302 of object 301, thereby forming less or non-mobile depositions on surface 302.

Gas may be introduced into the module via tubes 104 and 104' and outlets 106 and 106', respectively. However, it should be appreciated that there may also one single tube 104, 104', or a plurality of tubes 104, 104', and there may also be one single outlet 106, 106' as well as a plurality of outlets 106, 106'.

As mentioned above, in an embodiment surface 302 may acts as a kind of chemical getter, for example in combination with the presence of hydrogen radicals and/or halogens. Hence, surface 302 is arranged to retain metal contaminants and may be used in a method for binding metal contaminants. However, in another embodiment, the getter function is used in a method for cleaning. As described above, object 301 with surface 302 may also act as (part of) a cleaning arrangement for cleaning (treating) an optical element. Below, the latter function of surface 302 is described in more detail.

Cleaning and treating metal contaminants and metal depositions with hydrogen radicals and halogens can be combined or alternated. Deposition, for example deposition comprising Sn, may be removed in an embodiment by halogens (as gasses), for example, $F_2$, $Cl_2$, $Br_2$ and $I_2$ and, in another embodiment by hydrogen radicals, and in yet a further embodiment by combinations of hydrogen radicals and one or more halogens, either applied simultaneously or subsequently. In case there is a deposition with e.g. Sn, due to the presence of small amounts of oxygen, there will usually also be to some extent Sn oxide. To remove Sn oxides, a reduction step may be used before elemental Sn can be removed. Hence, in an embodiment, the cleaning process of surface to be cleaned may comprise the process of providing hydrogen radical containing gas to a surface to be cleaned. In yet another embodiment, the cleaning process comprises the process of providing hydrogen radical containing gas to surface to be cleaned wherein hydrogen radical containing gas further comprises one or more halogen gases (such as mentioned above). In another embodiment, the cleaning process of surface to be cleaned may comprise the process of providing hydrogen radical containing gas to surface to be cleaned and subsequently providing hydrogen radical containing gas to surface to be cleaned wherein hydrogen radical containing gas further comprises one or more halogen gasses. In yet a another embodiment, the cleaning process of surface to be cleaned may comprise the process of providing hydrogen radical containing gas to surface to be cleaned and subsequently providing a halogen containing gas to surface to be cleaned. The processes of these embodiments may optionally further comprise a subsequent process comprising providing hydrogen radical containing gas to surface to be cleaned. With these processes, Sn (or other metals) and/or C may be removed, and are especially applicable for the removal of Sn.

Hence, hydrogen radicals, either for reduction or for removal have to be provided to at least part of a surface of collector 50, or in general to at least part of surface 202 to be cleaned of optical element 201. Such surfaces are e.g. the EUV reflecting surfaces of reflectors 142, 143 and 146 which are contaminated with deposition like Sn. Further, hydrogen radicals may be used to remove carbon deposition by formation of volatile hydrocarbons.

In another embodiment, the module containing object 301 is maintained during cleaning (treating) at a pressure between about $10^{-7}$ and 500 mbar, desirably between about $10^{-2}$ and 1 mbar. In another embodiment, the partial pressure of hydrogen (i.e. including the above mentioned analogues) in the module is between about 0.01 and 500 mbar, more desirably between about 10 and 300 mbar (see also above). The total gas pressure is in an embodiment equal to or below about 500 mbar, more desirably equal to or below about 300, even more desirably equal to or below about 200 mbar (i.e. including hydrogen gas). The above mentioned pressures also apply during cleaning/treating. Likewise, the flow of the hydrogen radical containing gas 96 is in an embodiment at least 1 m/s.

Referring to FIG. 4b, the invention is also directed to lithographic apparatus 1, further comprising first cleaning arrangement 250, first cleaning arrangement 250 comprising hydrogen containing gas source 700 and hydrogen radical source 103 and optionally halogen containing gas source 700', lithographic apparatus 1 further comprising optical element 201 (or another element) having second surface 202, wherein second surface 202 is to be cleaned from metal deposition (either as direct deposition or redeposition or both deposition and redeposition; including in an embodiment metal oxides) from source SO or from other sources or origins (see above), wherein cleaning arrangement 250 is arranged to provide hydrogen radical containing gas 96, optionally halogen containing gas 100' or both hydrogen radical containing gas 96 and optional halogen containing gas 100 to second surface 202 of optical element 201, and wherein object 301 with first surface 302 is further configured to retain metal redeposition (as described above).

Figure 4C:
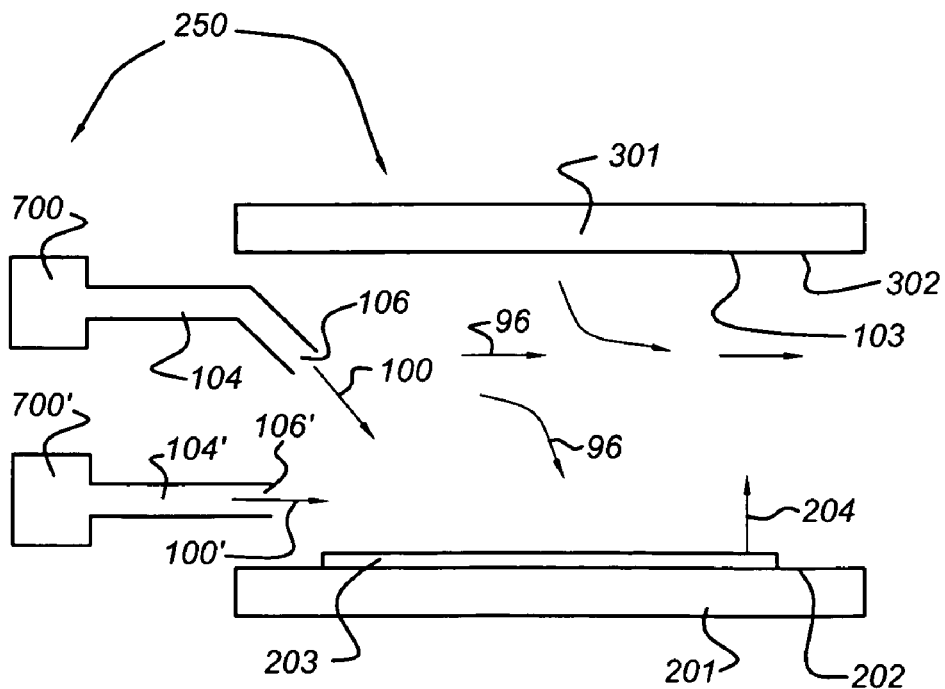

In another embodiment, cleaning arrangement 250 is arranged to provide hydrogen radical containing gas 96 between first surface 302 and second surface 202, as for instance schematically indicated in FIG. 4a (and also in FIG. 4c). Further, object 301 may be movable in the direction of second surface 202 and cleaning arrangement 250 may be arranged to provide hydrogen radical containing gas 96 between first surface 302 and second surface 202. Surface 302 may herein be used as getter, scavenging volatile hydrides 204 such as Sn hydrides and/or volatile Sn halides 204 and or (small) Sn particles.

First surface 302 may not only be used as getter, first surface 302 may also be used as catalyst. Especially when metal surface 302 is selected from one or more metals from the group of Ru, Rh, Pd, Ag, Re, Os, Ir, Pt and Au, hydrogen in hydrogen containing gas 100 may dissociate at surface 302 and form hydrogen radicals. This may happen even at ambient temperatures. Hence, as indicated in FIG. 4c, second surface 302 is not only arranged to retain contaminants, such as Sn, but may also be arranged to dissociate hydrogen (and optionally analogues thereof) and thereby be arranged to be a hydrogen radical source 103. Here, first surface 302 comprises the catalytic surface, i.e. is also hydrogen radical generator 103.

Therefore, in another embodiment cleaning arrangement 250 is arranged to provide hydrogen containing gas 100 between first surface 302 and second surface 202. Again, object 201 may be movable in the direction of second surface 202 (and is thus arranged substantially outside the region traversed by radiation beam B generated by source SO during lithographic processing). In another embodiment, one or more metals selected from the group of Ru, Rh, Pd, Ir and Pt is applied. In a variant, one or more of Ru and Pt is selected.

In yet another embodiment, referring to FIGS. 4b and 4c, lithographic apparatus 1 further comprises first cleaning arrangement 250, first cleaning arrangement 250 comprising halogen containing gas source 700', lithographic apparatus 1 further comprising optical element 201 having second surface 202, wherein second surface 202 is to be cleaned from metal deposition 203 from source SO or from other sources and origins, wherein cleaning arrangement 250 is arranged to provide halogen containing gas 100' to second surface 202 of optical element 201, and wherein object with first surface 302 is further configured to retain metal redeposition. Contaminants attach to surface 302 and metal deposition 203 may, due to the presence of halogens, form volatile halides (such as chlorides or iodides of Sn, Zn or Mn), with redeposit on surface 302 (usually as metal or metal oxide). At least part of the volatile halides may also be exhausted (see above). Cleaning arrangement 250 may be arranged to provide halogen containing gas 100' between first surface 302 and second surface 202, and as mentioned above, object 301 may be movable, such that surface 302 can be moved into the direction of surface 202. In this way, (re)deposition on surface 302 of volatilized deposition 203 of surface 202 may be increased, leading to a decrease or removal of deposition 203. Volatilized deposition is indicated with reference number 204.

Figure 4D:
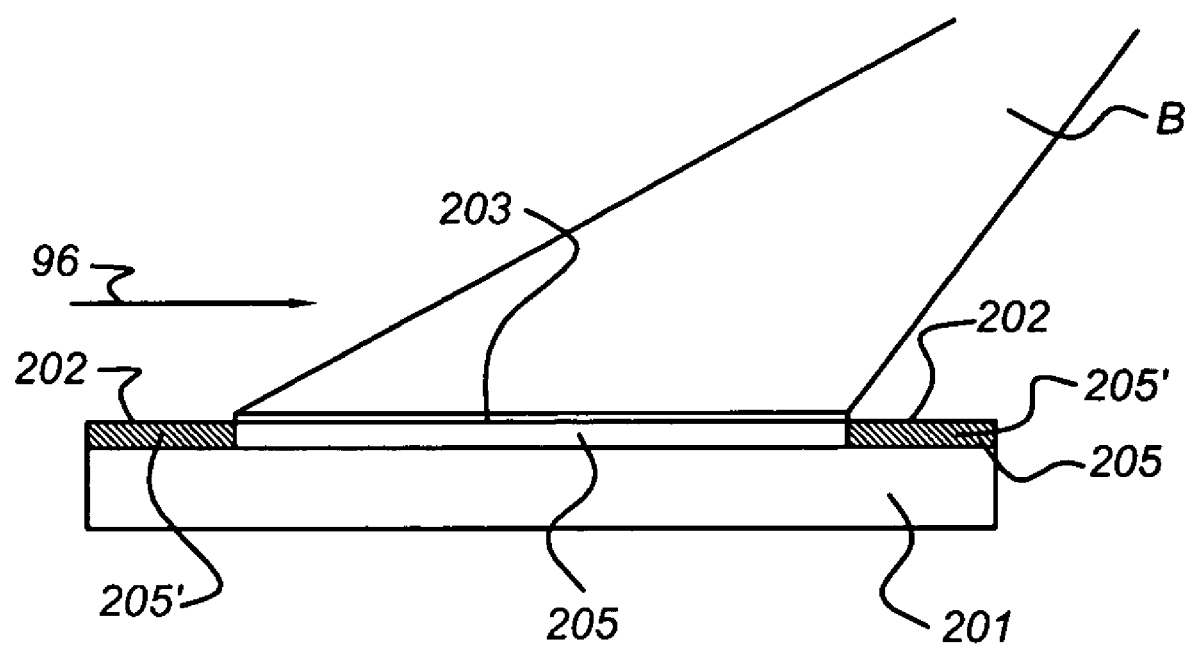

Yet another embodiment is depicted in FIG. 4d. FIG. 4d schematically depicts optical element 201, especially a mirror or a grating, having a coating 205. The coating may comprise in an embodiment one or more metals from the group of Ru, Rh, Pd, Ag, Re, Os, Ir, Pt and Au. Such coating may be used as capping layer, as spectral purity layer, etc. Optical element 201 is arranged in lithographic apparatus 1 to be irradiated partly by beam B. For instance, optical element 201 may be a collector mirror 50 or a spectral purity filter 51, etc., wherein the optical element is coated by coating 205. Part of the surface is irradiated by beam B. This will in general also be the part where a substantial amount of the metal deposition 203 is found, originating directly from source SO (this especially applies to collector mirror 50 as optical element 201). Deposition on surface 202 of optical element 201 is indicated with reference number 203. Part of coating 205 is not irradiated. This is indicated with hatched areas 205'. These areas have a surface that contains no or only to a small amount of deposition 203. Hence, those parts that are not irradiated by beam B, i.e. as indicated in FIG. 4d with areas 205', may be applied as surface 302. Hence, in an embodiment, parts 205' of surfaces 202 that are not irradiated by beam B are used as surface 302, thereby providing, for example in combination with one or more of hydrogen 100, hydrogen radicals 96 and halogen gas 100', the function of getter (and optionally also radical generator 103). Parts 205' of surface 202 may also be parts of surface 202 that are in the shadow of elements of lithographic apparatus 1 which are arranged in beam B. For instance, contamination trap 49 may introduce some shadows on for instance collector mirror 50. These shadow areas, which are also areas 205', are not irradiated by beam B and may also be used as getter surface 302 and/or as catalytic surface 103.

In a further embodiment, referring to FIG. 4d, part 205 of surface 203 may be irradiated by radiation beam B. This part is used for the formation of the image on wafer (further in the apparatus; not shown in this figure). This part is within the region traversed by radiation beam B generated by radiation source SO and is used for the formation of the image. First surface 302, here indicated as parts 205' of surface 202 is however substantially outside the region traversed by the radiation beam B and is not traversed by beam B. However, radiation at the sides/wings of beam B may still irradiate parts 205' of surface 202. Hence, in an embodiment parts 205' may be arranged substantially outside the region traversed by radiation beam B generated by radiation source SO during lithographic processing, but may not be outside the entire path of the radiation beam. However, when parts 205' are more remote (than depicted in the schematic FIG. 4d), they may also be arranged outside the path of radiation beam B.

The embodiments described above and with reference to FIGS. 4b and 4c, and also FIG. 4d, may not only be used to clean optical element 201 form deposition 203, but may alternatively or additionally also be used to protect surface 202 of optical element 201 from deposition of contaminants (especially Sn and C deposition): i.e. object 301 is a getter (as described above). Due to the presence of halogens and/or hydrogen radicals, volatile contaminants are formed, which may be exhausted (Sn halides or Sn hydrides, $CH_4$) or which are preferentially retained as metal or compound thereof on surface 302 of object 301 (Sn halides or Sn hydrides).

According to a further embodiment of the invention, a method is provided for binding metal contaminants in lithographic apparatus 1 comprising a radiation source SO, in an embodiment a metal-vapor based EUV radiation source SO (such as a Sn discharge source for generating EUV radiation), the method comprising the use in lithographic apparatus 1 of object 301 having first surface 302 wherein first surface 302 comprises metal surface, wherein in an embodiment the metal is selected from one or more metals from the group of Ru, Rh, Pd, Ag, Os, Ir, Pt and Au, wherein first surface 302 is configured to retain metal from the metal-vapor based EUV radiation source and/or from other sources and origins, and wherein first surface 302 is arranged substantially outside the region traversed by the radiation beam B generated by radiation source SO during lithographic processing. The method may further comprise providing one or more gasses selected from the group of hydrogen containing gas 100, hydrogen radical containing gas 96 and halogen containing gas 100'. Due to the presence of one or more of these gasses, deposition may be volatilized and deposit on surface 302 (see above).

The contaminants to be gettered by surface 302 are one or more contaminants selected from the group of metals, metal oxides, metal hydrides, metal hydroxide, metal halides and metal oxyhalides. These contaminants are volatile or may be volatilized and may deposit at surface 302, and form there a metal, metal oxide, metal hydride, metal hydroxide, metal halide and metal oxyhalide deposition.

In another embodiment, the method for binding (retaining) metal contaminants is used to clean (including treating) surface 202 of optical element 201 or of other elements. Therefore, a method is provided wherein lithographic apparatus 1 further comprises optical element 201 having second surface 202, wherein surface 202 is to be cleaned from metal deposition 203 (including redeposition from elsewhere), the method further comprising providing one or more gasses selected from the group of hydrogen containing gas 100, hydrogen radical containing gas 96 and halogen containing gas 100' to second surface 202 of optical element 201. Especially a method for cleaning optical element 201 in lithographic apparatus 1 is provided, the method comprising the use in lithographic apparatus 1 of object 301 having first surface 302 wherein first surface 302 comprises a metal surface, wherein in an embodiment the metal is selected from one or more metals from the group of Ru, Rh, Pd, Ag, Re, Os, Ir, Pt and Au, wherein first surface 302 is configured to retain metal contaminants from the metal-vapor based EUV radiation source SO or metal contaminants from other sources which may (re)deposit on first surface 302, wherein first surface 302 is arranged substantially outside the region traversed by the radiation beam B generated by radiation source SO during lithographic processing, optical element 201 having second surface 202, wherein 202 second surface 202 is to be cleaned from metal deposition, the method further comprising providing one or more gasses selected from the group of a hydrogen containing gas 100, a hydrogen radical containing gas 96 and halogen containing gas 100'.

First surface 302 getters contaminants and provides the effect that, due to the presence of one or more of hydrogen radicals (or hydrogen), and halogens, deposition on optical elements or other elements is removed and deposits at first surface 302. First surface 302 thereby gets contaminated. When for instance surface 302 is also arranged to generate hydrogen radicals, the contamination of surface 302 (i.e. the contamination of hydrogen radical source 103), may be undesired. Hence, in another embodiment lithographic apparatus 1 further comprises a second cleaning arrangement, wherein the second cleaning arrangement is arranged to clean first surface 302 from metal deposition. Further, also a method is provided as described above, further comprising cleaning first surface 302 form metal deposition. The second cleaning arrangement is not depicted. The second cleaning arrangement may be arranged in situ or ex situ of lithographic apparatus 1.

Figure 5A:
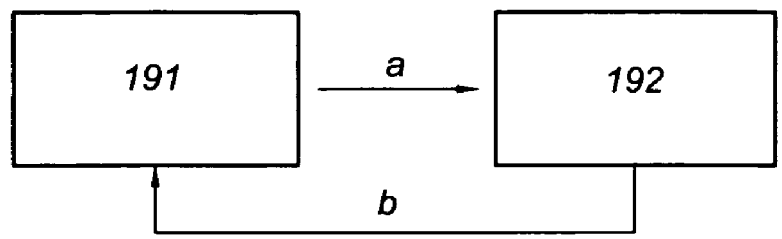
FIGS. 5a-5c depict embodiments of processes according to the invention.
Figure 5B:
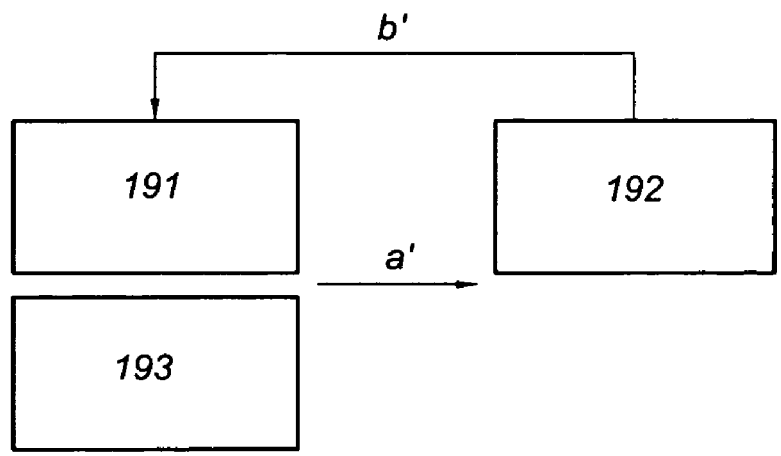
Figure 5C:
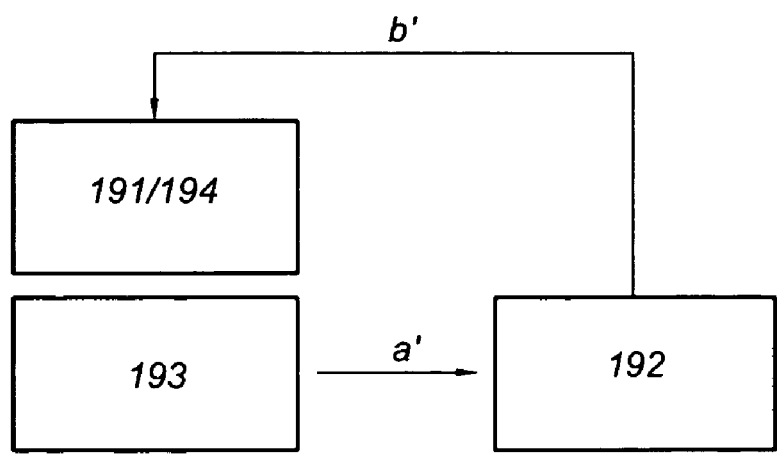

A number of processed that may be performed are schematically shown in FIGS. 5a-5c. In stage 191, object 301 functions as getter and scavenges contaminants. After some time, surface 302 of object 301 is optionally transferred (a) to the second cleaning arrangement and in stage 192, surface 302 of object 301 is cleaned. After substantial removal of deposition on surface 302 of object 301, the object can again be used and can be transferred back (b) from the second cleaning arrangement to the position where it fulfills its getter function (i.e. retaining contaminants). For instance, such process may be performed by using a rotating disc with surface 302 or using a translating tape with surface 302, a movable arm 360 etc.

FIG. 5b shows the same scheme as described above. However, object 301 is not only used to getter metal from the source, but is also used to clean (i.e. remove deposition) an element of the lithographic apparatus, such as optical element 201. This is indicated with reference number 193, which indicates a cleaning stage wherein surface 202 of optical element 201 is cleaned (with cleaning arrangement 250). This cleaning will take place due to the presence of hydrogen radicals and/or halogens. These volatilize the deposition and metal contaminants may subsequently deposit on surface 301. After some time, surface 302 of object 301 is optionally transferred (a) to the second cleaning arrangement and in stage 192, surface 302 of object 301 is cleaned. After substantial removal of deposition on surface 302 of object 301, the object can again be used and can be transferred back (b) from the second cleaning arrangement to the position where it fulfills its getter function and cleaning function.

In FIG. 5c, surface 302 is not only a getter, but also has the function of a hydrogen radical source 103. These functions are indicated as 191/194, wherein this reference indicate a gettering stage and cleaning stage, wherein object 301 is a getter (191) and is a catalyst (194) for the formation of hydrogen radicals from hydrogen. After some time, surface 302 of object 301 is optionally transferred (a) to the second cleaning arrangement and in stage 192, surface 302 of object 301 is cleaned. After substantial removal of deposition on surface 302 of object 301, the object can again be used and can be transferred back (b) from the second cleaning arrangement to the position where it fulfills its getter function 191 and cleaning function 193 and hydrogen radical generating function 194.

The above described processes may be promoted by applying heat. Hence, in another embodiment the lithographic apparatus may further comprise a heating arrangement (not depicted) arranged to heat one or more selected from the group of the hydrogen containing gas, the hydrogen radical containing gas, the halogen containing gas, and optical element 201. Heating may for instance be performed in a range between room temperature and about 250° C., especially between about 100 and 250° C. For instance, heating elements may be used to heat collector mirror 50 during the cleaning process as described above to a temperature between about 100 and 250° C.

The present invention may not only be used during cleaning of optical elements or other elements from Sn, etc., the present invention may also be applied during cleaning from carbon deposition. By formation of hydrogen radicals 96, be it by a separate hydrogen radical source 103 as depicted in for instance FIG. 4a or be it a noble metal surface (or a metal surface of a metal of the platinum group), also carbon depositions are removed by formation of volatile hydrocarbons such as $CH_4$. These hydrocarbons may simply be exhausted by exhaust 550 (via pump 400).

According to another embodiment of the invention, there is provided object 201 for a vacuum environment, wherein the vacuum environment comprises hydrogen gas 100 at a pressure between 0.01 and 500 mbar, object 201 comprising first surface 202 configured to retain metal atoms and compounds thereof.

Figure 6:
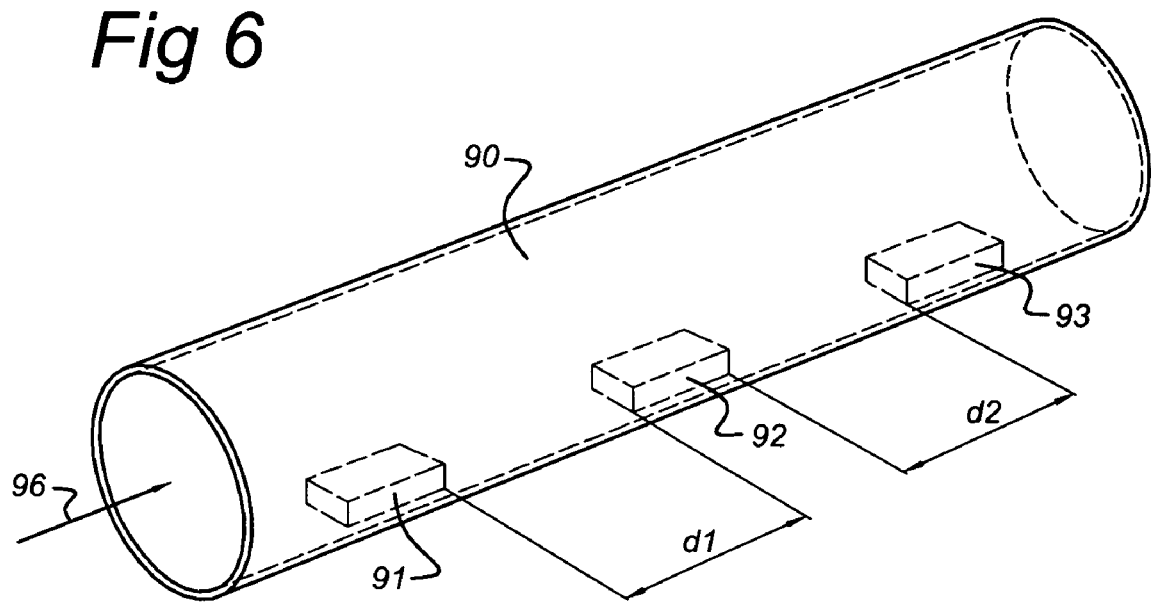
FIG. 6 depicts a setup used in an experiment.

Referring to FIG. 6, several experiments were done with a thick layer 91 of Sn at the entrance of flow tube 90, and clean samples 92 and 93, at distances d1 and d2, respectively, further downstream in tube 90.

In all transport experiments a flow tube made fully of glass was used. In the first experiment the pressure was 20 mbar and bare silicon samples 92 and 93 were used as witness samples. The sample 91 at the entrance of the tube has a layer of around 50-60 nm of Sn deposited onto a silicon substrate. When the hydrogen radicals 96 are flown into tube 90 over sample 91, some Sn will be removed from this thick sample 91. The witness samples 92,93 serve to test whether Sn will re-deposit on these samples 92,93. In this first experiment no Sn was found on the witness samples after roughly 4 minutes of exposure to hydrogen radicals.

Next, the same experiment was repeated, but this time using Ru samples as witness samples 92,93. In this case there was clear evidence of Sn transport and deposition on the witness samples; after 3 minutes of exposure to hydrogen there was around 0.1 nm of Sn on both witness samples 92,93, while around 5 nm of Sn had been removed from the thick Sn sample 91.

When comparing these two experiments, it is clear that the type of substrate material 92,93 influences whether or not Sn deposits. Deposition on noble metals (such as Au, Ag) and metals from the platinum group (such as Ru, Rh, Pd, Os, Ir and Pt) is good, whereas on other materials deposition is worse. Since surface 302 is configured to retain deposition, the material of surface 302 is especially selected from the herein described noble metals and platinum group metals, more desirably Ru and/or Pt.

Tubes herein refer to gas tube or gas pipes, i.e. tubes for transporting gasses, such as hydrogen.

It should be appreciated that gas flows may be in other directions than depicted.

The invention is not limited to EUV radiation alone, but may also be used for lithographic apparatus that use other radiation, as described above. Other contaminants as a result of other radiation sources SO than Sn sources, or from another origin such as solder, etc. may also be removed by cleaning arrangement 250 and cleaning method of the invention. Further, in addition to the metals or metal compounds mentioned above based on Sn, Zn, and Mn, also other metals (or metal compounds) may be retained by first surface 302.

The cleaning method of the invention may also be used to clean other surfaces than surfaces of optical elements, such as walls, supporting structures, gas locks, etc. Likewise, the method for retaining metal contaminants may also be used getter metal contaminants that could otherwise deposit on other surfaces than surfaces of optical elements, such as walls, supporting structures, gas locks, etc. The getter (i.e. first surface) may not only prevent or reduce deposition on optical elements but may also prevent or reduce deposition on elements such as walls, etc. In an embodiment, element 201 may not only represent an optical element, but may in an embodiment represent any element in lithographic apparatus 1. Each surface in lithographic apparatus 1 may benefit from the presence of surface 302.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively.

The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus, comprising:
   a radiation source configured to provide a radiation beam; and
   an object with a first surface configured to retain metal contaminations, the first surface being arranged substantially outside a region traversed by the radiation beam generated by the radiation source during lithographic processing, wherein the object is configured to be movable into the region during a cleaning process.

2. The lithographic apparatus according to claim 1, wherein the first surface is not arranged in the path of the radiation beam generated by the radiation source during lithographic processing.

3. The lithographic apparatus according to claim 1, wherein the first surface is configured to retain metal contaminants selected from the group of metal, metal oxides, metal hydroxides, metal hydrides, metal halides and/or metal oxyhalides of one or more elements selected from the group of Sn, Mn and/or Zn.

4. The lithographic apparatus according to claim 1, wherein the radiation source comprises a metal-vapor based EUV radiation source, and the first surface is configured to retain metal from the metal-vapor based EUV radiation source.

5. The lithographic apparatus according to claim 1, wherein the radiation source is a Sn radiation source.

6. The lithographic apparatus according to claim 1, wherein the first surface comprises a metal surface and the metal is selected from one or more metals from the group of Ru, Rh, Pd, Ag, Re, Os, Ir, Pt and/or Au.

7. The lithographic apparatus according to claim 1, wherein the first surface is not a surface layer of an optical element.

8. The lithographic apparatus according to claim 1, further comprising:
   a first cleaning arrangement, the first cleaning arrangement comprising
   a hydrogen containing gas source; and
   a hydrogen radical source; and
   an optical element having a second surface, wherein the second surface is to be cleaned from metal deposition, the first cleaning arrangement is arranged to provide a hydrogen radical containing gas to the second surface of the optical element, and the object with the first surface is further configured to retain metal redeposition.

9. The lithographic apparatus according to claim 8, wherein the first cleaning arrangement is arranged to provide hydrogen containing gas and/or hydrogen radical containing gas between the first surface and the second surface.

10. The lithographic apparatus according to claim 8, wherein the object is movable in the direction of the second surface and the first cleaning arrangement is arranged to provide hydrogen containing gas and/or hydrogen radical containing gas between the first surface and the second surface.

11. The lithographic apparatus according to claim 10, wherein the first cleaning arrangement further comprises a halogen containing gas source.

12. The lithographic apparatus according to claim 11, wherein the first cleaning arrangement is configured to provide hydrogen containing gas, hydrogen radical containing gas, and/or halogen containing gas between the first surface and the second surface.

13. The lithographic apparatus according to claim 8, wherein the first cleaning arrangement further comprises a halogen containing gas source.

14. The lithographic apparatus according to claim 13, wherein the first cleaning arrangement is configured to provide hydrogen radical containing gas and/or halogen containing gas to the second surface of the optical element.

15. The lithographic apparatus according to claim 13, wherein the first cleaning arrangement is configured to provide hydrogen containing gas, hydrogen radical containing gas, and/or halogen containing gas between the first surface and the second surface.

16. The lithographic apparatus according to claim 1, wherein the first surface comprises a catalytic surface.

17. The lithographic apparatus according to claim 1, further comprising a second cleaning arrangement, wherein the second cleaning arrangement is configured to clean the first surface from metal deposition.

18. The lithographic apparatus according to claim 1, further comprising:
   a first cleaning arrangement, the first cleaning arrangement comprising a halogen containing gas source;
   an optical element having a second surface, wherein the second surface is to be cleaned from metal deposition, the first cleaning arrangement is configured to provide a halogen containing gas to the second surface of the optical element, and the object with the first surface is further configured to retain metal redeposition.

19. The lithographic apparatus according to claim 18, wherein the first cleaning arrangement is configured to provide the halogen containing gas between the first surface and the second surface.

20. The lithographic apparatus according to claim 18, wherein the object is movable in the direction of the second surface and the first cleaning arrangement is configured to provide the halogen containing gas between the first surface and the second surface.

21. A lithographic apparatus, comprising;
a radiation source configured to provide a radiation beam; and
an object with a first surface configured to retain metal contaminants, wherein the first surface is arranged substantially outside a region traversed by the radiation beam generated by the radiation source during lithographic processing, the first surface comprises a metal surface wherein the metal is selected from one or more metals from the group of Ru, Rh, Pd, Ag, Re, Os, Ir, Pt and/or Au, and the first surface is not a surface layer of an optical element, wherein the object is configured to be movable into the region during a cleaning process.

22. A method for binding metal contaminations in a lithographic apparatus comprising a radiation source configured to generate a radiation beam, the method comprising:
positioning an object in the lithographic apparatus, the object having a first surface configured to retain metal contaminations, the first surface being arranged substantially outside a region traversed by the radiation beam generated by the radiation source during lithographic processing; and
moving the object into the region during a cleaning process.

23. The method according to claim 22, wherein the first surface comprises a metal surface wherein the metal is selected from one or more metals from the group of Ru, Rh, Pd, Ag, Re, Os, Ir, Pt and/or Au.

24. The method according to claim 22, further comprising providing one or more gasses selected from the group of a hydrogen containing gas, a hydrogen radical containing gas and/or a halogen containing gas.

25. The method according to claim 22, wherein the metal contaminants are one or more metal contaminants selected from the group of metals, metal oxides, metal hydroxides, metal hydrides, metal halides and/or metal oxyhalides of one or more elements selected from the group of Sn, Mn and/or Zn.

26. The method according to claim 22, further comprising cleaning the first surface from metal deposition.

27. A method for cleaning an optical element in a lithographic apparatus comprising a radiation source configured to generate a radiation beam, the method comprising:
positioning an object in the lithographic apparatus, the object having a first surface configured to retain metal contaminations, the first surface being arranged substantially outside a region traversed by the radiation beam generated by the radiation source during lithographic processing, the optical element having a second surface, wherein the second surface is to be cleaned from metal deposition;
moving the object into the region during a cleaning process; and
providing one or more gasses selected from the group of a hydrogen containing gas, a hydrogen radical containing gas and/or a halogen containing gas to the second surface of the optical element.

28. The method according to claim 27, wherein the first surface comprises a metal surface and the metal is selected from one or more metals from the group of Ru, Rh, Pd, Ag, Re, Os, Ir, Pt and/or Au.

29. The method according to claim 27, wherein the metal contaminants are one or more metal contaminants selected from the group of metals, metal oxides, metal hydroxides, metal hydrides, metal halides and/or metal oxyhalides of one or more elements selected from the group of Sn, Mn and/or Zn.

30. The method according to claim 27, wherein the radiation source is a Sn radiation source.

31. The method according to claim 27, wherein providing one or more gasses comprises providing one or more gasses between the first surface and the second surface.

32. The method according to claim 27, further comprising cleaning the first surface from metal deposition.

* * * * *